(12) United States Patent
Shen

(10) Patent No.: US 8,633,555 B2
(45) Date of Patent: Jan. 21, 2014

(54) MAGNETIC SENSOR

(75) Inventor: Kuei-Hung Shen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/451,553

(22) Filed: Apr. 20, 2012

(65) Prior Publication Data

US 2013/0168787 A1    Jul. 4, 2013

(30) Foreign Application Priority Data

Dec. 28, 2011   (TW) .............................. 100149264 A

(51) Int. Cl.
  *H01L 29/82*   (2006.01)
  *H01L 21/02*   (2006.01)
  *G11C 11/22*   (2006.01)
  *G11C 11/15*   (2006.01)

(52) U.S. Cl.
  USPC ............ 257/421; 257/295; 365/145; 365/173

(58) Field of Classification Search
  USPC ................ 257/421, 295; 438/3; 365/145, 173
  See application file for complete search history.

(56) References Cited

U.S. PATENT DOCUMENTS

| | | | |
|---|---|---|---|
| 7,355,822 B2 | 4/2008 | Daughton et al. | |
| 7,660,081 B2 | 2/2010 | Daughton et al. | |
| 7,846,564 B2 | 12/2010 | Li et al. | |
| 7,982,461 B2 | 7/2011 | Aiso | |
| 2003/0206382 A1* | 11/2003 | Carey et al. | 360/324.12 |
| 2004/0253437 A1* | 12/2004 | Ingvarsson et al. | 428/329 |
| 2007/0034919 A1* | 2/2007 | Wang et al. | 257/295 |
| 2007/0171581 A1* | 7/2007 | Childress et al. | 360/324.12 |
| 2007/0171694 A1* | 7/2007 | Huai et al. | 365/145 |
| 2008/0094888 A1* | 4/2008 | Chen et al. | 365/173 |
| 2008/0191251 A1* | 8/2008 | Ranjan et al. | 257/295 |
| 2011/0076516 A1 | 3/2011 | Li et al. | |
| 2011/0133298 A1 | 6/2011 | Chen et al. | |

FOREIGN PATENT DOCUMENTS

| | | |
|---|---|---|
| CN | 101620915 | 1/2010 |
| CN | 101752051 | 6/2010 |

OTHER PUBLICATIONS

Xiaoming Kou, et al., "High temperature annealing induced superparamagnetism in CoFeB/MgO/CoFeB tunneling junctions", Journal of applied physics, Vol.108, 2010, p. 083901-1-083901-4.

(Continued)

*Primary Examiner* — Long K Tran
*Assistant Examiner* — Dzung Tran
(74) *Attorney, Agent, or Firm* — Jiang Chyun IP Office

(57) ABSTRACT

A magnetic sensor suitable for sensing an external magnetic field includes a magnetic tunnel junction (MTJ) device. The MTJ device is used to sense an out-of-plane (Z-axis) component of the external magnetic field at a perpendicular direction to the MTJ device. The MTJ device includes a first pinned magnetic layer, a tunnel layer and a magnetic sensing layer. The first pinned magnetic layer has a pinned magnetization perpendicular to the first pinned magnetic layer. The tunnel layer is disposed on the first pinned magnetic layer. The magnetic sensing layer is disposed on the tunnel layer. The magnetic sensing layer has a critical thickness set to be within a range having a superparamagnetic property, in which an out-of-plane (Z-axis) magnetic sensitivity is larger than an in-plane (X-axis, Y-axis) magnetic sensitivity. The first pinned magnetic layer, the tunnel layer and the magnetic sensing layer are stacked in a forward sequence or a reverse sequence.

20 Claims, 5 Drawing Sheets

(56) References Cited

OTHER PUBLICATIONS

Lubna R. Shah, et al., "Magnetic tunneling junction based magnetic field sensors: Role of shape anisotropy versus free layer thickness", Journal of applied physics, Vol.109, 2011, p. 07C731-1-07C731-3.

J. Cao, et al., "Wheatstone bridge sensor composed of linear MgO magnetic tunnel junctions", Journal of applied physics, vol. 107, 2010, p. 09E712-1-09E712-3.

Youngman Jang, et al., "Magnetic field sensing scheme using CoFeB/MgO/CoFeB tunneling junction with superparamagnetic CoFeB layer", Applied Physics Letters 89, 2006, p. 163119-1-163119-3.

* cited by examiner

MAGNETIC SENSOR

CROSS-REFERENCE TO RELATED APPLICATION

This application claims the priority benefit of Taiwan application serial no. 100149264, filed on Dec. 28, 2011. The entirety of the above-mentioned patent application is hereby incorporated by reference herein and made a part of this specification.

TECHNICAL FIELD

The disclosure relates to a magnetic sensor.

BACKGROUND

The magnetic sensor can be used to sense the magnetic components of an external magnetic field such as the geomagnetic field. The magnetic sensor has been applied to fields such as automobiles, auto-control systems, medical systems, and electronic compasses, in which the electronic compass needs to sense the three magnetic components of the external magnetic field. The smartphone is typically implemented with an electronic compass nowadays. The electronic compass needs to sense the geomagnetic field and thus requires the magnetic sensing capability to sense the three axes of the magnetic field. In addition, high sensitivity is needed for the electronic compass because of the geomagnetic field.

The magnetic sensor may have various designs. The magnetic tunnel junction (MTJ) device has been widely used to sense the horizontal component of an external magnetic field. The magnetic sensing layer of the conventional MTJ device may be formed by in-plane magnetic anisotropy (IMA) materials, which have relatively high sensitivity for the in-plane component of the magnetic field but relatively low sensitivity for the out-of-plane component of the magnetic field. In other words, even if the thickness of the magnetic sensing layer for the conventional MTJ device is controlled at the superparamagnetic condition, the MTJ device is still insensitive to the out-of-plane (Z-axis) component of magnetic field with relatively high sensitivity for the in-plane (X-axis and Y-axis) components of the magnetic field. One reason is that, although the magnetic moments for the superparamagnetic IMA are isotropically distributed, the superparamagnetic IMA maintains the in-plane property. Therefore, the response to the out-of-plane (Z-axis) magnetic field needs to overcome the demagnetization energy in order for the magnetic moments to be perpendicular to the magnetic sensing layer, resulting in insensitivity to the Z-axis magnetic field.

A MTJ device with a simple structure for sensing the out-of-plane (Z-axis) magnetic component of the geomagnetic field is under development.

SUMMARY

The disclosure provides a magnetic sensor adopting the structure of a MTJ device capable of sensing an out-of-plane magnetic component of an external magnetic field, and further sensing the three magnetic components at three axes of X, Y and Z.

The disclosure provides a magnetic sensor suitable for sensing an external magnetic field, comprising a MTJ device. The MTJ device is used to sense an out-of-plane (Z-axis) magnetic component of the external magnetic field at a perpendicular direction to the MTJ device. The magnetic sensor includes a first pinned magnetic layer, a tunnel layer and a magnetic sensing layer. The first pinned magnetic layer has a pinned magnetization perpendicular to the first pinned magnetic layer. The tunnel layer is disposed on the first pinned magnetic layer. The magnetic sensing layer is disposed on the tunnel layer. The property of the magnetic sensing layer is perpendicular magnetic anisotropy. The magnetic sensing layer has a thickness set to be within a range having a superparamagnetic property, in which an out-of-plane (Z-axis) magnetic sensitivity at a perpendicular direction to the magnetic sensing layer is larger than an in-plane (X-axis, Y-axis) magnetic sensitivity. The magnetic sensing layer senses an out-of-plane (Z-axis) magnetic component of the external magnetic field, perpendicular to the magnetic sensing layer, with the out-of-plane magnetic sensitivity. The pinned magnetic layer, the tunnel layer and the magnetic sensing layer are stacked in a forward sequence or a reverse sequence.

The disclosure provides a magnetic sensor suitable for sensing an external magnetic field. The magnetic sensor includes a magnetic concentrator to direct the external In-Plane (X-axis and Y-axis) magnetic field towards a Z-axis. An extending plane of the magnetic concentrator has an X-axis and a Y-axis, and the Z-axis perpendicular to the extending plane. A first position and a second position are located on the X-axis. A third position and a fourth position are located on the Y-axis. A first MTJ device to a fourth MTJ device are located on the first to the fourth positions of the magnetic concentrator, respectively, to sense a first sensing quantity, a second sensing quantity, a third sensing quantity and a fourth sensing quantity on the Z-axis. The MTJ devices include a pinned magnetic layer having a fixed magnetic field perpendicular to the pinned magnetic layer; a tunnel layer disposed on the pinned magnetic layer. A magnetic sensing layer is disposed on the tunnel layer. The property of the magnetic sensing layer is perpendicular magnetic anisotropy. The magnetic sensing layer has a thickness set to be within a range having a superparamagnetic property, in which an out-of-plane (Z-axis) magnetic sensitivity is larger than an in-plane (X-axis, Y-axis) magnetic sensitivity. The magnetic sensing layer senses an out-of-plane (Z-axis) magnetic component of the external magnetic field on the magnetic sensing layer at perpendicular direction, with the out-of-plane magnetic sensitivity. The pinned magnetic layer, the tunnel layer and the magnetic sensing layer are stacked in a forward sequence or a reverse sequence.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

The disclosure provides an out-of-plane or perpendicular MTJ device and a magnetic sensor formed from the MTJ device. The structure of the MTJ device includes a pinned magnetic layer, a tunnel layer and a magnetic sensing layer, which may be stacked. A material of the magnetic sensing layer in film is perpendicular magnetic anisotropy (PMA), of which direction of an easy axis is perpendicular to the magnetic sensing layer, that is, along the Z-axis direction. The horizontal plane of the magnetic sensing layer is usually referred to as the XY plane. The disclosure provides a structure capable of sensing the Z component of a geomagnetic field. An electronic compass can use the disclosed structure to solve the issue of high fabrication cost.

In the disclosure, when the magnetic material is thinner than a critical thickness set to be within a range having a superparamagnetic property, the superparamagnetic property would appear due to theimal disturbance, resulting that the directions of micro magnetic moments presents chaos arrangement in the environment with zero magnetic field. The total magnetic moment approaches zero when no external magnetic field applied. When an external magnetic field is applied thereon, the magnetic moment is changed in accordance with the external magnetic field. The magnetization (or magnetic moment) nears the point of zero-field would have a certain large range in linear relation, and then reach to saturation.

If the magnetic sensing layer of the MTJ device is at the superparamagnetic property, the magnetic moment vector of the pinned magnetic layer is perpendicular to the film plane, and the magnetoresistance at zero field is at the intermediate state, then the magnetroresistance has a linear sensing region with respect to the out-of-plane (Z-axis) component of magnetic field perpendicular to the film plane. The magnetoresistance is basically not changed with the in-plane (X-axis, Y-axis) component of magnetic field along the horizontal film plane. This property can be used to sense the Z component of magnetic field, which is along the same axial direction of the pinned magnetic moment.

Figure 1A:
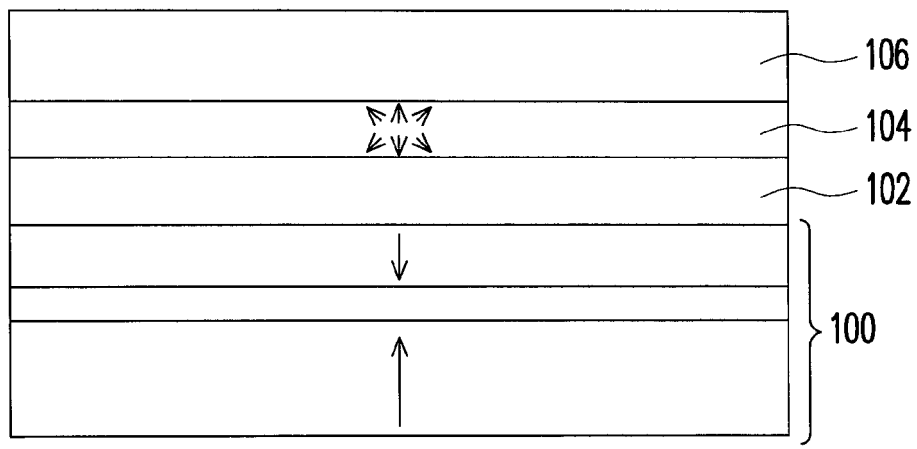
FIG. 1A is a schematic diagram illustrating a cross-sectional structure of a MTJ device, according to an exemplary embodiment.

FIG. 1A is a schematic diagram illustrating a cross-sectional structure of magnetic sensor, according to an exemplary embodiment. The magnetic sensor includes an out-of-plane MTJ device, and the MTJ device mainly includes a pinned magnetic layer 100, a tunnel layer 102 and a magnetic sensing layer 104 in a stacked structure. In addition, according to the need of practical design, a capped layer 106 can be further disposed over the magnetic sensing layer 104. The magnetic sensing layer 104 is made of PMA material and has a thickness set to be within a range having superparamagnetic property. The variance of the magnetization (or magnetic moment) at the perpendicular direction has high sensitivity with linear relation with variance of Z component of the external magnetic field, allowing to sensing the Z component of magnetic field.

The pinned magnetic layer 100 can be a single film layer or multiple layers formed by synthetic antiferromagnet (SAF). The SAF structure is taken as the example in the embodiment, which is also to be further described in FIG. 2. By measuring magnetoresistance of the MTJ device, the magnetic field at the Z direction can be obtained. The magnetoresistance is approaching to an intermediate state when no external magnetic field is applied. Since the magnet moment direction of the pinned magnetic layer is parallel or antiparallel to the magnet moment direction of the magnetic sensing layer 104, as two limited values, the magnetoresistance with positive sign or negative sign relative to the intermediate state represents the magnitude and the direction of Z component of magnet field.

Since the two magnetic layers of the pinned magnetic layer 100 have different distances to the magnetic sensing layer 104, they would produce different levels of magnetic field on the magnetic sensing layer 104 if the magnetic moments of the magnetic layers of the pinned magnetic layer 100 are the same. In other words, a total magnetic field applied on the magnetic sensing layer 104 from the pinned magnetic layer 100 is not zero. This would cause the intermediate state of the magnetoresistance is not at the state with zero magnetic field. For this issue, it can be solved by adjusting magnetic moments of the two magnetic layers of the pinned magnetic layer 100 to reduce the offset of the magnetic sensing curve of magnetoresistance versus the Z component of magnetic field. In the embodiment, the magnetic moment can be adjusted by changing thickness of the magnetic layer or the film structure.

Figure 1B:
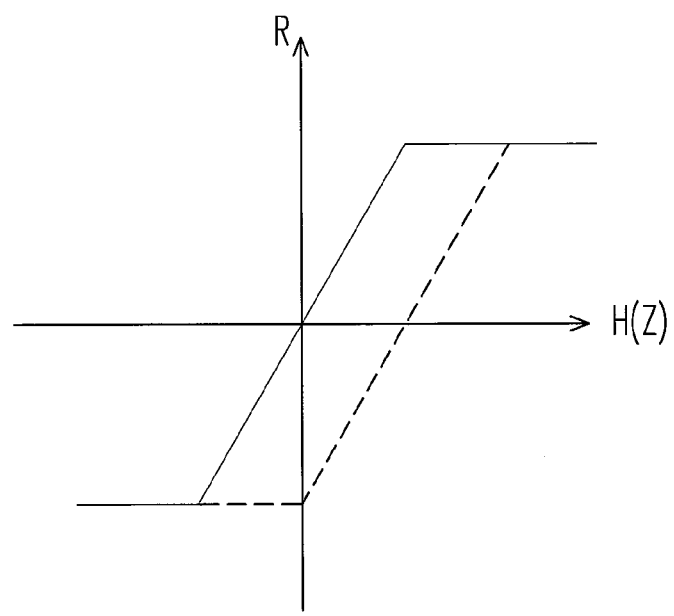
FIG. 1B is a schematic diagram illustrating a relation between magnetoresistance and magnetic field for the MTJ device in FIG. 1A, performed with the superparamagnetic property, according to an exemplary embodiment.

FIG. 1B is a schematic diagram illustrating a relation between magnetoresistance and magnetic field for the MTJ device in FIG. 1A, performed with the superparamagnetic property, according to an exemplary embodiment. In FIG. 1B, the abscissa is the magnitude of the magnetic field H on the Z axis in FIG. 1A, and the ordinate is the variance of magnetoresistance of the MTJ device in FIG. 1A. At the zero field region, the magnetoresistance is linearly varying with the magnitude of the magnetic field H. Thereby, the magnetic sensor operated at the zero field region can sense the Z component of the magnetic field H. Here, the dashed line represents one of the phenomena of the magnetic sensing curve of magnetoresistance with the offset when the pinned magnetic layer 100 is not modified. The solid line is an ideal magnetic sensing curve of magnetoresistance after the pinned magnetic layer 100 is modified.

Figure 2:
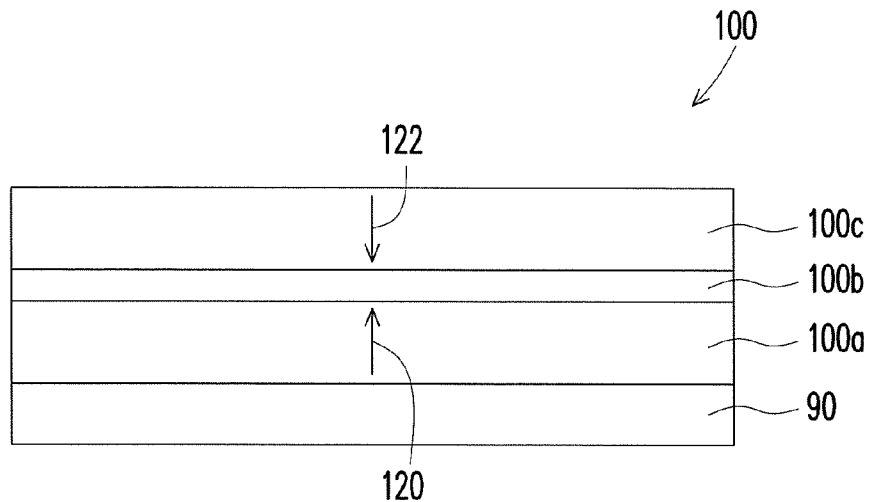
FIG. 2 is a schematic diagram illustrating a cross-sectional structure of synthetic antiferromagnet in FIG. 1A, according to an exemplary embodiment.

FIG. 2 is a schematic diagram illustrating a cross-sectional structure of synthetic antiferromagnet in FIG. 1A, according to an exemplary embodiment. The pinned magnetic layer 100 is a SAF structure of PMA. In FIG. 2, the pinned magnetic layer 100 with the SAF structure includes a stacked structure of a second ferromagnetic layer 100a, a non-magnetic metal layer 100b and a first ferromagnetic layer 100c, in which the first ferromagnetic layer 100c is closer to the magnetic sensing layer 104 than the second ferromagnetic layer 100a. The second ferromagnetic layer 100a has a magnetic moment 120 at the perpendicular direction. The magnetic moment 120 may be changed by adjusting a thickness of the second ferromagnetic layer 100a, for example. The second ferromagnetic layer 100a is a synthetic magnetic layer and is usually formed on a substrate 90. The non-magnetic metal layer 100b is disposed on the second ferromagnetic layer 100a. The first ferromagnetic layer 100c is disposed on the non-magnetic metal layer 100b. The first ferromagnetic layer 100c has a magnetic moment 122 at the perpendicular direction. To adjust the magnetic moment 122, it can be done by adjusting a thickness of the first ferromagnetic layer 100c, in an example. The magnetic moment direction of the magnetic moment 120 is antiparallel to the magnetic moment direction of the magnetic moment 122. The semiconductor fabrication processes are subsequently taken to foil n a stacked structure. The tunnel layer of the MTJ device such as the tunnel layer 102 in FIG. 1A can be framed. To adjust the total magnetic field applied on the magnetic sensing layer 104 from the pinned magnetic layer 100, it can be achieved by simply adjusting the thickness or the film structure of the second ferromagnetic layer 100a, the non-magnetic metal layer 100b, the first ferromagnetic layer 100c and/or tunnel layer 102. For example, the magnetic moment 122 of the first ferromagnetic layer 100c is smaller than the magnetic moment 120 of the second ferromagnetic layer 100a. A difference of the magnetic moments 120 and 122 reduce an offset of a magnetic sensing curve of magnetoresistance versus the out-of-plane (Z-axis) component of a magnetic field of the magnetic sensor.

In addition, the SAF structure of the pinned magnetic layer 100 is not limited to three layers. It can be formed by film layers more than 3. In the embodiment, the non-magnetic metal layer 100b may be Ru, Ir or other non-magnetic metal. The ferromagnetic layers 100a, 100c on top and bottom of the non-magnetic metal layer 100b can be made of PMA material. The PMA material may be Co/Pt, Co/Pd or other multilayer films. The PMA material may also be CoPt, CoPd, FePt or other alloys. The PMA material may also be an interfacial-induced PMA material, such as MgO (or AlOx)/CoFeB, MgO (or AlOx)/Co, or MgO (or AlOx)/Fe. The PMA material may also be a composite structure with any of the aforesaid PMA materials.

In the embodiment, the magnetic filed of the pinned magnetic layer 100 in SAF structure applied on the magnetic sensing layer 104 would reduce the offset of the magnetic sensing curve of magnetoresistance with respect to the Z component of magnetic field, such as the solid line in FIG. 1B, in which the intermediate state of magnetoresistance would be near the position of zero field.

Still referring to FIG. 1A, the material of the tunnel layer 102 can be oxide (e.g. aluminium oxide, magnesium oxide, titanium oxide and so on). The magnetic sensing layer 104 is structured by sufficiently thin PMA material so as to have the superparamagnetic property, such as CoFeB of 10-11 angstroms and covered by Ta with 5~10 angstroms. This structure is annealed at 360° C. for 2 hours and then the superparamagnetic property is achieved. Thereafter, the MTJ device may also be coated with a capped layer 106. The annealing process is performed after the capped layer 106 is formed by a deposition process. Lithographic and etching processes can then be performed to pattern the MTJ device. According to actual design needs, an insulating dielectric layer may be formed over the outer surface of the MTJ device to protect the MTJ device. For a circuit chip, the process of interconnect layout over the MTJ device can be subsequently performed.

Figure 3:
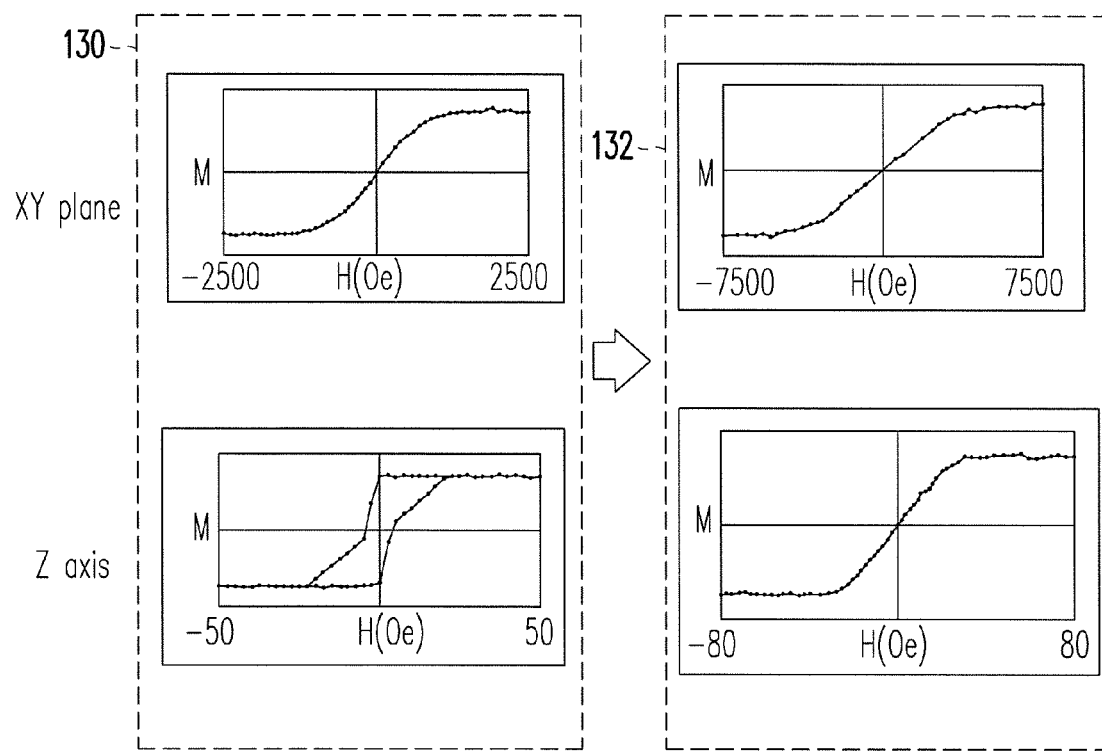
FIG. 3 is a schematic diagram illustrating superparamagnetic property of MTJ device.

FIG. 3 is a schematic diagram illustrating superparamagnetic property of MTJ device. In FIG. 3, the stacked structure of MTJ device is taking a stacked structure of Ta30/MgO12/CoFeB/Ta10/Ru30/Ta100 as an example. The CoFeB is the material to form the PMA of the magnetic sensing layer 104. The number attached with the material is thickness with unit of angstrom. The abscissa represents the direction and magnitude of the magnetic field, the ordinate represents the magnetization. When thickness of the CoFeB is larger than the superparamagnetic critical thickness set to be within a range having a superparamagnetic property, the characteristics for the magnetic field with respect to the magnetization is shown in block 130. When thickness of the CoFeB is less than the superparamagnetic critical thickness, the characteristics for the magnetic field with respect to the magnetization is shown in block 132.

In block 130, the upper figure shows the variance of in-plane (XY plane) magnetic field on the XY plane. The lower figure shows the variance of the out-of-plane (Z axis) magnetic field on the Z axis. When thickness of the CoFeB is larger than the superparamagnetic critical thickness, although the variance of magnetization at the in-plane direction (XY plane) near the zero field is linear variance, it is not sensitive. Although the variance of magnetization at the out-of-plane direction (Z axis) has sufficient sensitivity, it has the hysteresis loop near the zero field, not linear variance.

In block 132, the upper figure shows the variance of in-plane (XY plane) magnetic field on the XY plane. The lower figure shows the variance of the out-of-plane (Z axis) magnetic field on the Z axis. When thickness of the CoFeB, such 11 angstroms, is less than the superparamagnetic critical thickness, the variance of magnetization at the in-plane direction (XY plane) is not sensitive but the variance of magnetization at the out-of-plane direction (Z axis) has sufficient sensitivity and is linear variance near the zero field. The out-of-plane MTJ device can precisely sense the Z component of the magnetic field without influence from the in-plane (X axis, Y axis) component of magnetic field. Therefore this kind of MTJ device can be as a Z-axis magnetic sensor.

Observation from variance of magnetization in the block 132, the sensitivity at the X axis and Y axis is low but the sensitivity at the Z axis is relatively high.

According to verification from experiment, when the PMA material is sufficiently thin, the superparamagnetic property also appears but the magnetic field sensing property is contrary to the superparamagnetic property of IMA material. The superparamagnetic property occurring on the PMA film being sufficiently thin is sensitive at Z axis at a good level, as shown in block 132 but not sensitive at in-plane.

The disclosure based on the above phenomena has proposed a Z-axis magnetic sensing MTJ device, of which the magnetic sensing layer is PMA with superparamagnetic property. The pinned magnetic layer is also PMA material. In addition, a symmetric property of the magnetic sensing curve of magnetoresistance with respect to the Z axis can be adjusted by disposing another PMA pinned magnetic layer on the opposite side of the magnetic sensing layer. The offset of the magnetic sensing curve of magnetoresistance versus the Z component of magnetic field can be reduced. This, the variance of magnetoresistance at Z axis can be a linear region with high sensitivity but insensitivity to the X axis and Y axis, and thereby it can be used to sense Z component of magnetic field.

Several adjusting mechanisms to reduce the offset of the magnetic sensing curve of magnetoresistance versus the Z component of magnetic field are described as follows.

Figure 4:
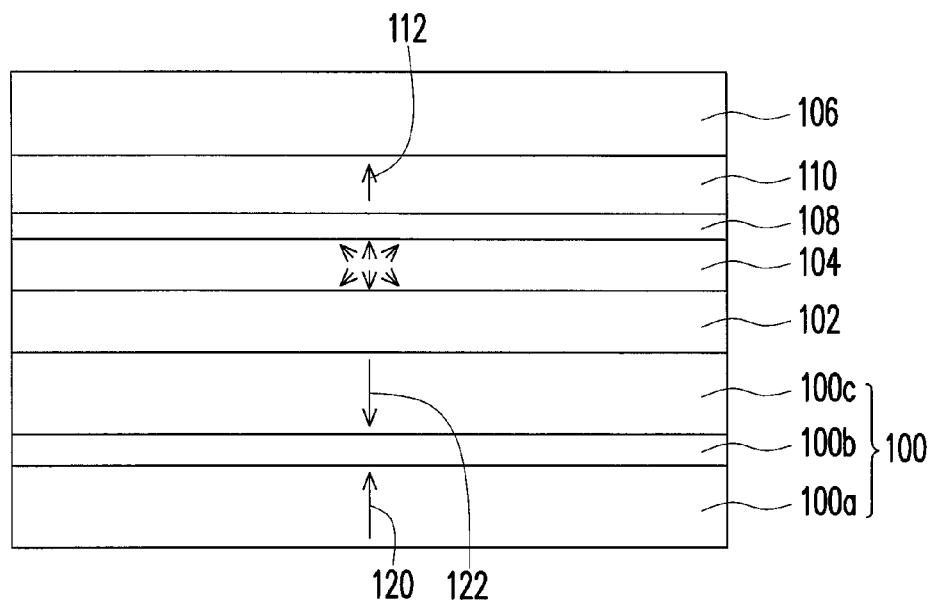
FIG. 4 is a schematic diagram illustrating a cross-sectional structure of a MTJ device, according to another exemplary embodiment.

FIG. 4 is a schematic diagram illustrating a cross-sectional structure of a MTJ device, according to another exemplary embodiment. In FIG. 4, using the MTJ structure shown in embodiment of FIG. 1A as the basis, a magnetic bias layer 110 and non-magnetic intermediate layer 108 can be fanned between the magnetic sensing layer 104 and the capped layer 106 in the present embodiment. The magnetic bias layer 110 can have a magnetic moment 112, referred as magnetic bias field, to adjust the magnetic field applied on the magnetic sensing layer 104 from the pinned magnetic layer 100. The direction of the magnetic moment 112 is perpendicular to the magnetic bias layer 110. The magnetic moment 112 in an example can be at the opposite direction to the direction of the magnetic moment 122 of the first ferromagnetic layer 100c. In this situation, the magnetic moments 120 and 122 of the second and the first ferromagnetic layers 100a and 100c can be equal strength. A difference of magnetic fields applied on the magnetic sensing layer 104 from the magnetic moments 120 and 122 caused by distance effect can be corrected by the magnetic moment 112. In addition, the non-magnetic intermediate layer 108 between the magnetic bias layer 110 and the magnetic sensing layer 104 can be thin oxide layer with low resistance or non-magnetic metal layer.

Figure 5:
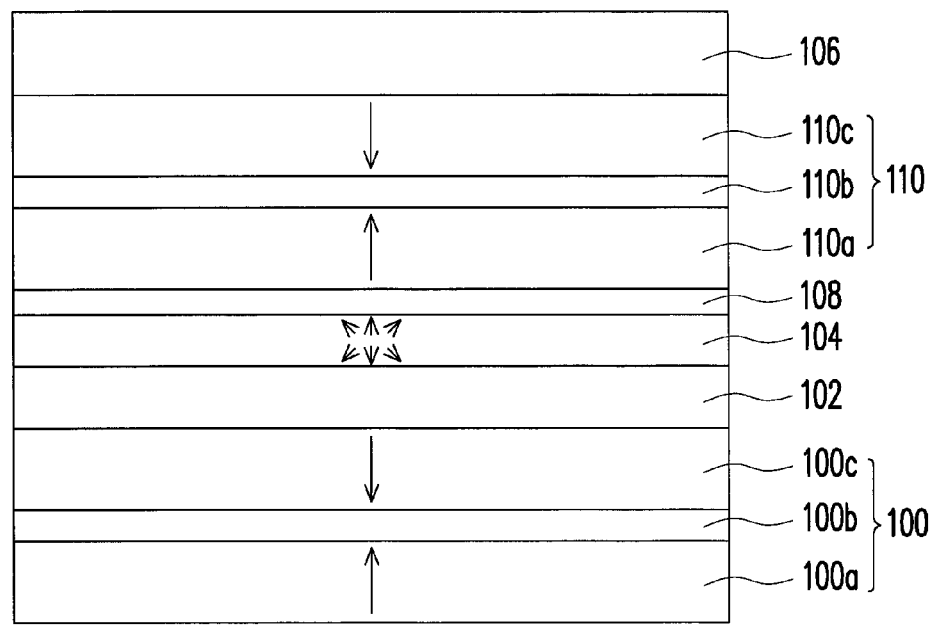
FIG. 5 is a schematic diagram illustrating a cross-sectional structure of a MTJ device, according to another exemplary embodiment.

Further, the magnetic bias layer 110 in the embodiment can be single layer. However, it can also be a multi-layer SAF structure. For example, FIG. 5 is a schematic diagram illustrating a cross-sectional structure of a MTJ device, according to another exemplary embodiment. Descriptions of the embodiment can also be referred to the description in FIG. 4. The difference from FIG. 4 is that the embodiment in FIG. 5 uses a SAF layer to serve as the magnetic bias layer 110. In FIG. 5, the magnetic bias layer 110 includes a stacked structure of a first ferromagnetic layer 110a, a non-magnetic metal layer 110b, and a second ferromagnetic layer 110c, wherein the first ferromagnetic layer 110a is closer to the magnetic sensing layer 104 than the second ferromagnetic layer 110c. Formation of the first ferromagnetic layer 110a, the non-magnetic metal layer 110b, and the second ferromagnetic layer 110c can be referred to the descriptions in FIG. 2 about the pinned magnetic layer 100. The magnetic moments of the first ferromagnetic layer 110a and the second ferromagnetic layer 110c are antiparallel to form the anti-ferromagnetic structure. A direction of a total magnetic filed applied on the magnetic sensing layer 104 from the first and second ferromagnetic layers 110a and 110c is also antiparallel to a total magnetic filed applied on the magnetic sensing layer 104 from the first and second ferromagnetic layers 100c and 100a. In this structure, the adjustment is done by letting the pinned magnetic layer 100 and the magnetic bias layer 110 separately apply total magnetic fields on the magnetic sensing layer, so as to obtain a balance for the magnetic fields.

Figure 6:
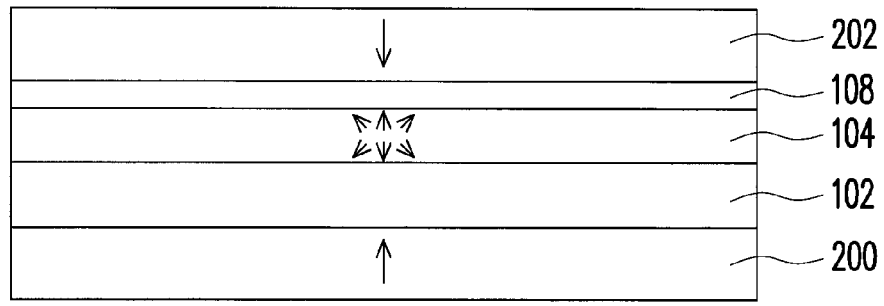
FIG. 6 is a schematic diagram illustrating a cross-sectional structure of a MTJ device, according to further another exemplary embodiment.

FIG. 6 is a schematic diagram illustrating a cross-sectional structure of a MTJ device, according to further another exemplary embodiment. General descriptions of the embodiment can be referred to FIG. 1A through FIG. 5. The difference from the implementation of FIG. 5 is that the embodiment of FIG. 6 takes the pinned magnetic layer 200 in single-layer structure to replace the pinned magnetic layer 100 in FIG. 5 and takes the magnetic bias layer 202 in single-layer structure to replace the magnetic bias layer 110 in FIG. 5. In the embodiment of FIG. 6, magnetic moments of the magnetic bias layer 202 and the magnetic bias layer 202 are antiparallel to each other. The offset of the magnetic sensing curve of magnetoresistance versus the Z component of magnetic field on the magnetic sensing layer 104 can be reduced. As a result, the generated total magnetic field on Z axis can be approaching to zero. Here, the total magnetic field on Z axis is referring to net magnetic fields perpendicular to the film plane.

As shown in those embodiments above, the adjustment of net magnetic field on the magnetic sensing layer 104 can be done by various mechanisms and not limited to a specific mechanism. The embodiments can also be suitably combined to one another.

Further descriptions to sense magnetic field in 3-dimensional based on out-of-plane MTJ device are provided, so that the 3D measurement of magnetic field can be achieved and can have various applications.

Figure 7A:
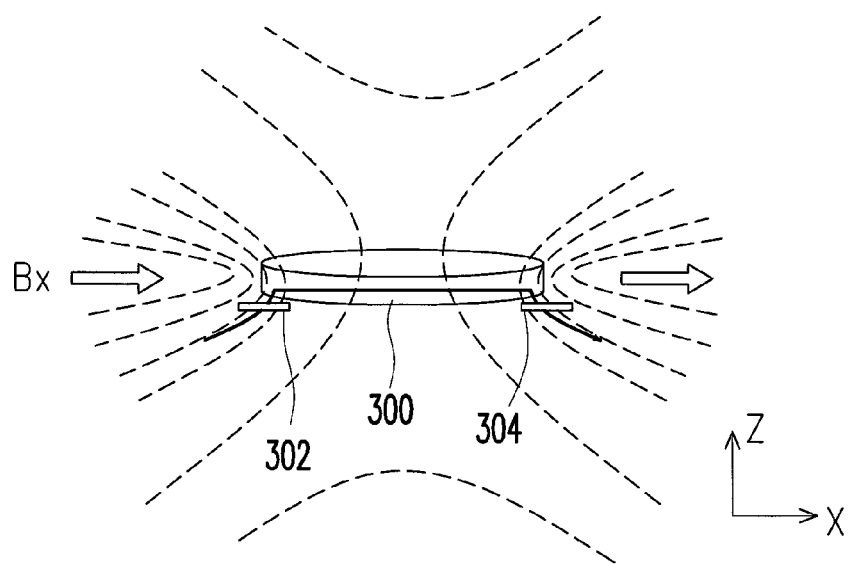
FIG. 7A is a schematic diagram illustrating a structure of a 3D magnetic sensor, according to an exemplary embodiment.

FIG. 7A is a schematic diagram illustrating a structure of a 3D magnetic sensor, according to an exemplary embodiment.

In FIG. 7A, A 3D magnetic sensor can be used to sense three components (X, Y and Z) of an external magnetic field, such as geomagnetic field. The embodiment uses a magnetic concentrator 300 to direct an external in-plane magnetic field of the external magnetic field towards the Z-axis. The external in-plane magnetic field includes X-axis component Bx and/or Y-axis component By. The magnetic concentrator 300 has an extending plane that is also referred as a horizontal plane. The extending plane has an X-axis and a Y-axis thereon. A Z-axis is perpendicular to the extending plane. Three components of the external magnetic field are represented by Bx, By and Bz, respectively. The concerns in FIG. 7A are about the deflecting change of magnetic field on the XZ plane of the magnetic concentrator 300 and the two out-of-plane MTJ devices 302, 304, which are disposed on the X-axis. The implementation of MTJ devices 302 and 304 can be referred to descriptions for foregoing FIG. 1A through FIG. 6.

Due to the high permeability of the magnetic concentrator 300, the in-plane component of the external magnetic field, such as the magnetic field Bx on the X-axis, is deflected toward the Z axis. However, the two symmetric positions of the magnetic concentrator 300 at equal distance from the center would produce a difference in positive Z direction and negative Z direction. Two out-of-plane MTJ devices 302, 304 are respectively disposed on the two positions. The magnetoresistance of the out-of-plane MTJ device 302 is R1, and the magnetoresistanc of the out-of-plane MTJ device 304 is R2. The magnetoresistance R1 and the magnetoresistance R2 are expressed by equations (1) and (2):

$$R1 = a*Bx + b*Bz; \text{ and} \quad (1)$$

$$R2 = -a*Bx + b*Bz, \quad (2)$$

where the parameters a and b are the characteristic coefficients related to the magnetic concentrator 300 and MTJ sensor. A simple algebraic computation can be performed in the circuit chip of the magnetic sensor or by an external circuit, so as to obtain the magnetic fields Bx and Bz. Likewise, the magnetic fields By and Bz can be obtained on the Y axis.

Figure 7B:
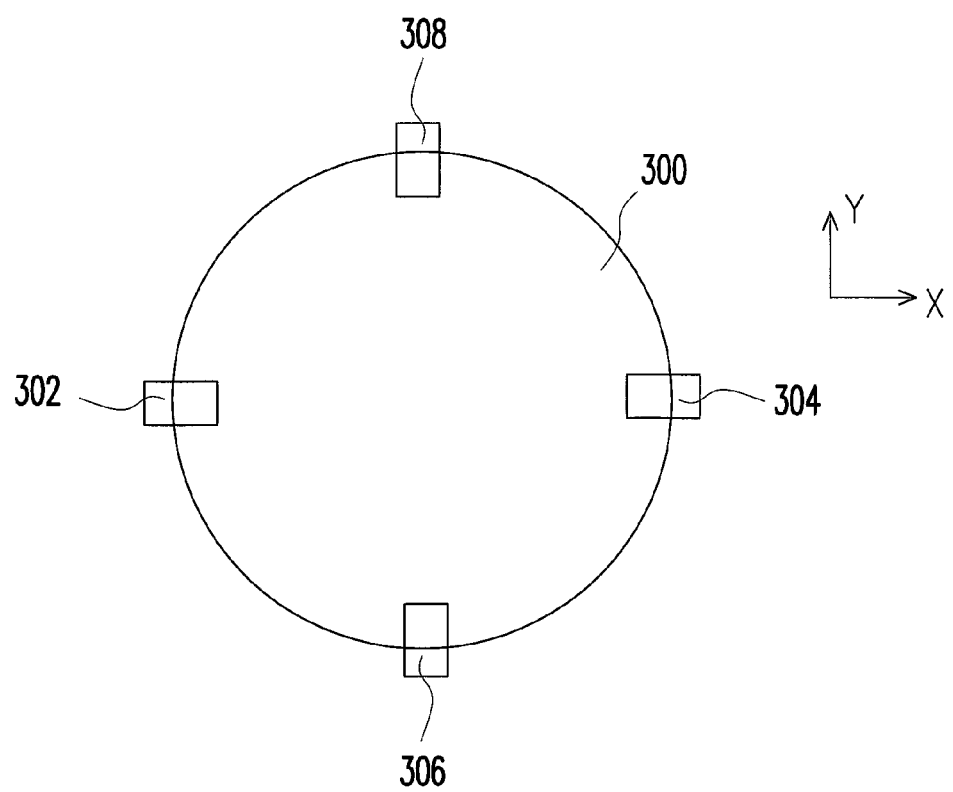
FIG. 7B is a schematic diagram illustrating a bottom-view structure of a 3D magnetic sensor in FIG. 7A.

FIG. 7B is a schematic diagram illustrating a bottom-view structure of a 3D magnetic sensor in FIG. 7A. The embodiment in FIG. 7B discloses the two out-of-plane MTJ devices 302 and 304 in FIG. 7A and also discloses two out-of-plane MTJ devices 306 and 308 on the Y axis of the magnetic concentrator 300 at the symmetric two positions. The implementation of the MTJ device 306 and 308 can be referred to the descriptions in FIG. 1A through FIG. 6. According to the similar mechanism in FIG. 7A, the MTJ device 306, the magnetic concentrator 300 and the MTJ device 308 can have similar operation and performance. The magnetic concentrator 300 can deflect another in-plane component of the external magnetic field, such as the magnetic field By at Y axis, towards the Z axis. Therefore, the magnetoresistane of the out-of-plane MTJ device 306 is R3, and the magnetoresistance of the out-of-plane MTJ device 308 is R4. The magnetoresistance R3 and the magnetoresistance R4 are expressed by equations (3) and (4):

$$R3 = c*By + d*Bz; \text{ and} \quad (3)$$

$$R4 = -c*By + d*Bz, \quad (4)$$

where the parameters c and d are the characteristic coefficients related to the magnetic concentrator 300 and MTJ sensor. In the embodiment, the magnetic concentrator 300 can be a circular disk and is symmetric at the two axes. Due to adjustment to have symmetry to the original point, the characteristic coefficients can be simplified to be a=c and b=d.

In another embodiment, the 3D magnetic sensor includes at least one out-of-plane MTJ device and at least one in-plane MTJ device. The implementation of the out-of-plane MTJ device can be referred to descriptions for foregoing FIG. 1A through FIG. 6. The in-plane MTJ device can be any magnetic sensor to measure the in-plane component at X axis and Y axis, including the conventional magnetic sensor. The out-of-plane MTJ device can sense the Z component Bz of the external magnetic field. The in-plane MTJ device can sense the X component Bx and Y component By of the external magnetic field.

The disclosure proposes an out-of-plane MTJ device, of which the magnetic sensing layer 104 is operated with superparamagnetic characteristics to sense the perpendicular component of magnetic field. In sensing applications measuring 3D magnetic fields, the out-of-plane MTJ device may be implemented with the magnetic concentrator 300 or the in-plane MTJ device.

It will be apparent to those skilled in the art that various modifications and variances can be made to the disclosed embodiments. It is intended that the specification and examples be considered as exemplary only, with a true scope of the disclosure being indicated by the following claims and their equivalents.

What is claimed is:

1. A magnetic sensor, suitable for sensing an external magnetic field, the magnetic sensor comprising:
   a magnetic tunnel junction (MTJ) device, to sense an out-of-plane (Z axis) component of the external magnetic field perpendicular to the MTJ device, wherein the MTJ device comprises:
      a pinned magnetic layer, having a pinned magnetization perpendicular to the pinned magnetic layer;
      a tunnel layer, disposed on the pinned magnetic layer; and
      a magnetic sensing layer, disposed on the tunnel layer, wherein the property of the magnetic sensing layer is perpendicular magnetic anisotropy, the magnetic sensing layer has a thickness set to be within a range having a superparamagnetic property, the superparamagnetic property is that an out-of-plane (Z:axis) magnetic sensitivity at a perpendicular direction to the magnetic sensing layer is larger than an in-plane (X-axis, Y-axis) magnetic sensitivity, and the magnetic sensing layer senses an out-of-plane (Z-axis) magnetic component of the external magnetic field, perpendicular to the magnetic sensing layer, with the out-of-plane magnetic sensitivity, wherein the pinned magnetic layer, the tunnel layer and the magnetic sensing layer are stacked in a forward sequence or a reverse sequence.

2. The magnetic sensor of claim 1, wherein the pinned magnetic layer is a synthetic antiferromagnet structure of perpendicular magnetic anisotropy, comprising a stacked structure of a first ferromagnetic layer, a non-magnetic metal layer and a second ferromagnetic layer, wherein the first ferromagnetic layer is closer to the magnetic sensing layer than the second ferromagnetic layer, the first ferromagnetic layer has a first magnetic moment, the second ferromagnetic layer has a second magnetic moment, and the first magnetic moment is antiparallel to the second magnetic moment.

3. The magnetic sensor of claim 2, wherein the first magnetic moment is smaller than the second magnetic moment, to reduce an offset of a magnetic sensing curve of magnetoresistance versus the out-of-plane component of the external magnetic field of the magnetic sensor.

4. The magnetic sensor of claim 1, further comprising:
   a magnetic bias layer, disposed over the magnetic sensing layer, opposite to the pinned magnetic layer, wherein the magnetic bias layer provides a magnetic bias field perpendicular to the magnetic bias layer in association with the pinned magnetic layer to reduce an offset of a magnetic sensing curve of magnetoresistance versus the out-of-plane component of the external magnetic field.

5. The magnetic sensor of claim 4, wherein the magnetic bias field of the magnetic bias layer is antiparallel to the pinned magnetization of the pinned magnetic layer.

6. The magnetic sensor of claim 4, wherein the magnetic bias layer is a synthetic antiferromagnet structure of perpendicular magnetic anisotropy, comprising a stacked structure of a first ferromagnetic layer, a non-magnetic metal layer and a second ferromagnetic layer,
   wherein the first ferromagnetic layer is closer to the magnetic sensing layer than the second ferromagnetic layer, the first ferromagnetic layer has a first magnetic moment, the second ferromagnetic layer has a second magnetic moment, and the first magnetic moment is antiparallel to the second magnetic moment.

7. The magnetic sensor of claim 4, wherein the magnetic bias layer is a single-layer structure.

8. The magnetic sensor of claim 1, wherein the pinned magnetic layer is a single-layer structure.

9. The magnetic sensor of claim 1, further comprising:
   an in-plane MTJ device, to sense an in-plane component of the external magnetic field.

10. The magnetic sensor of claim 1, wherein the MTJ device further comprises a capped layer, disposed over the magnetic sensing layer.

11. A magnetic sensor, suitable for sensing an external magnetic field, comprising:
    a magnetic concentrator, to direct an external in-plane magnetic field of the external magnetic field towards a Z-axis, wherein an extending plane of the magnetic concentrator has an X-axis and a Y-axis, and the Z-axis perpendicular to the extending plane, wherein the X-axis has a first position and a second position, and the Y-axis has a third position and a fourth position; and
    a first MTJ device, a second MTJ device, a third MTJ device and a fourth MTJ device are respectively located on the first, second, third and fourth positions of the magnetic concentrator, to sense a first sensing quantity, a second sensing quantity, a third sensing quantity, and a fourth sensing quantity on the Z-axis,
    wherein at least one of the first, second, third and fourth MTJ devices comprises:
       a pinned magnetic layer, having a pinned magnetization perpendicular to the pinned magnetic layer;
       a tunnel layer, disposed on the pinned magnetic layer; and
       a magnetic sensing layer, disposed on the tunnel layer, wherein the property of the magnetic sensing layer is perpendicular magnetic anisotropy, the magnetic sensing layer has a thickness set to be within a range having a superparamagnetic property, an out-of-plane (Z-axis) magnetic sensitivity is larger than an in-plane (X-axis, Y-axis) magnetic sensitivity, and the magnetic sensing layer senses an out-of-plane (Z-axis) magnetic component of the external magnetic field on the magnetic sensing layer at perpendicular direction, with the out-of-plane magnetic sensitivity, wherein the pinned magnetic layer, the tunnel layer and the magnetic sensing layer are stacked in a forward sequence or a reverse sequence.

12. The magnetic sensor of claim 11, wherein the first sensing quantity is $a*Bx+b*Bz$, the second sensing quantity is $-a*Bx+b*Bz$, the third sensing quantity is $c*By+d*Bz$, the fourth sensing quantity is $-c*By+d*Bz$, wherein a, b, c and d are characteristic coefficients, Bx, By and Bz are three magnetic field components of the external magnetic field at the X-axis, the Y-axis and the Z-axis, and the magnetic field components Bx, By and Bz are calculated out from the first, second, third and fourth sensing quantities.

13. The magnetic sensor of claim 12, wherein the magnetic concentrator is a symmetric structure and the characteristic coefficients for concentrating the external magnetic field are a=c and b=d.

14. The magnetic sensor of claim 11, wherein the pinned magnetic layer is a synthetic antiferromagnet (SAF) structure of perpendicular magnetic anisotropy (PMA), comprising a stacked structure of a first ferromagnetic layer, a non-magnetic metal layer and a second ferromagnetic layer, wherein the first ferromagnetic layer is closer to the magnetic sensing layer than the second ferromagnetic layer, the first ferromagnetic layer has a first magnetic moment, the second ferromagnetic layer has a second magnetic moment, and the first magnetic moment is antiparallel to the second magnetic moment.

15. The magnetic sensor of claim 14, wherein the first magnetic moment is smaller than the second magnetic moment, to reduce an offset of a magnetic sensing curve of magnetoresistance versus the out-of-plane (Z axis) component of the external magnetic field of the magnetic sensor.

16. The magnetic sensor of claim 11, wherein each of the first, second, third and fourth MTJ devices further comprises:
a magnetic bias layer, disposed over the magnetic sensing layer, opposite to the pinned magnetic layer, wherein the magnetic bias layer provides a magnetic bias field perpendicular to the magnetic bias layer in association with the pinned magnetic layer to reduce an offset of a magnetic sensing curve of magnetoresistance versus the out-of-plane (Z axis) component of the external magnetic field.

17. The magnetic sensor of claim 16, wherein the magnetic bias field of the magnetic bias layer is antiparallel to the pinned magnetization of the pinned magnetic layer.

18. The magnetic sensor of claim 16, wherein the magnetic bias layer is a synthetic antiferromagnet (SAF) structure of perpendicular magnetic anisotropy (PMA), comprising a stacked structure of a first ferromagnetic layer, a non-magnetic metal layer and a second ferromagnetic layer,
wherein the first ferromagnetic layer is closer to the magnetic sensing layer than the second ferromagnetic layer, the first ferromagnetic layer has a first magnetic moment, the second ferromagnetic layer has a second magnetic moment, and the first magnetic moment is antiparallel to the second magnetic moment.

19. The magnetic sensor of claim 16, wherein the magnetic bias layer is a single-layer structure.

20. The magnetic sensor of claim 11, wherein the pinned magnetic layer is a single-layer structure.

* * * * *